United States Patent [19]

Petcavich

[11] Patent Number: 4,666,263
[45] Date of Patent: May 19, 1987

[54] RADIANT ENERGY REFLECTOR AND METHOD FOR CONSTRUCTION THEREOF

[75] Inventor: Robert J. Petcavich, San Diego, Calif.

[73] Assignee: Deposition Technology, Inc., San Diego, Calif.

[21] Appl. No.: 819,797

[22] Filed: Jan. 16, 1986

[51] Int. Cl.[4] .................. G02B 1/00; G02B 5/08; B32B 15/08; C23C 14/20
[52] U.S. Cl. ..................... 350/640; 350/641; 428/624; 428/687; 428/673; 428/40; 428/458; 428/912.2; 427/164; 204/192.27
[58] Field of Search ................. 350/641, 642, 320; 428/912.2, 458, 40, 687, 624, 626, 673, 685; 204/192 C, 192 P, 129 SP

[56] References Cited

U.S. PATENT DOCUMENTS

| | | | |
|---|---|---|---|
| 1,285,901 | 11/1918 | Bausch et al. | 350/641 |
| 1,998,088 | 4/1935 | Langdon | 428/673 |
| 2,103,538 | 12/1937 | Kolb | 428/673 |
| 2,294,940 | 9/1942 | Skolnik | 350/641 |
| 2,952,189 | 9/1960 | Pajes | 350/642 |
| 3,427,096 | 2/1969 | Dykema et al. | 350/641 |
| 3,607,584 | 9/1971 | Becht | 350/641 |
| 3,776,805 | 12/1973 | Hansen | 428/458 |
| 4,340,646 | 7/1982 | Ohno et al. | 428/458 |
| 4,482,209 | 11/1984 | Grewal et al. | 350/642 |

FOREIGN PATENT DOCUMENTS

| | | | |
|---|---|---|---|
| 2908394 | 9/1980 | Fed. Rep. of Germany | 350/641 |
| 40348 | 3/1977 | Japan | 350/320 |
| 97155 | 8/1979 | Japan | 350/642 |
| 95901 | 7/1980 | Japan | 350/320 |

OTHER PUBLICATIONS

R. F. Denoyer et al., "Copper Polyethylene Terephthalate Laminate", *IBM Tech. Dis. Bull.*, vol. 9, No. 7, Dec. 1966.

*Primary Examiner*—Jon W. Henry
*Attorney, Agent, or Firm*—Bruno J. Verbeck

[57] ABSTRACT

Disclosed herein is a radiant energy reflector comprising a laminated article mounted on a contoured support. The article includes a specularly reflective layer of silver protected on one side thereof from deterioration-inducing agents by a transparent cover sheet of polymeric material, and on the opposite side thereof by a non-polymeric protective layer of substantially inert and corrosion-resistant material. Also disclosed is a method for producing the article which yields an intimate and tenacious bond between the cover sheet, reflective layer and protective layer, thus reducing the likelihood of delamination.

15 Claims, 3 Drawing Figures

RADIANT ENERGY REFLECTOR AND METHOD FOR CONSTRUCTION THEREOF

DESCRIPTION

1. Technical Field

The present invention pertains to a laminated article which is useful for constructing a radiant energy or light reflector.

2. Background Art

Reflectors exhibiting a high degree of specular reflectivity or specularity have long been employed to control the direction of light emitted by a radiant energy source. Because such reflectors are typically used in a wide variety of commercial applications wherein they are subjected to numerous varying environmental conditions, and further because their effectiveness necessarily entails maintaining the reflective surface at as high a degree of specularity as is possible, it is imperative that the reflective surface be protected against deterioration. Protection of the reflective surface is especially acute when the surface is formed from metal susceptible to oxidation and/or corrosion.

One solution to the problem has been to form the reflective surface as a component part of a flexible laminated article or sheet which is bonded to a support structure appropriately contoured to cause the reflective surface to assume a predetermined geometrical shape. An exemplary embodiment of such an article is disclosed in Roche, U.S. Pat. No. 4,307,150. Therein the article is formed by evaporating a metal onto a polymeric sheet, and then by coating the exposed side of the metallic layer thus formed with a polymeric solution that dries to form a transparent protective layer. When the article is bonded to a contoured support the protective layer faces towards the radiant energy source.

Drawbacks associated with laminated articles as typified by Roche include the fact that the bonds between the metallic layer and the layers on either side thereof are somewhat fragile. Any rough handling of the article can produce partial delamination, particularly at the edges of the article, which exposes the metallic layer to reducing agents present in the environment. Another drawback is that the structure of the article is likewise somewhat fragile, and thus must be handled carefully during manufacture to avoid scratching through the protective layer.

In view of the foregoing, the primary object of this invention is to provide a laminated article exhibiting a high degree of specularity and of durable construction.

Another object is to provide a laminated article which is less prone to delamination, thus providing more effective protection for the reflective surface against deterioration.

A still further object is to provide a method for producing a laminated article exhibiting a high degree of specularity, durable construction, and enhanced resistance to delamination, the method being especially well-suited to facilitate producing the article both quickly and economically.

The foregoing and other additional objects of this invention will be more readily understood from the ensuing description.

DISCLOSURE OF THE INVENTION

A radiant energy reflector produced in accordance with this invention includes a laminated article or sheet comprising a radiant energy transmissive cover sheet of polymeric material intimately bonded on one side thereof to a specularly reflective layer of silver. The term intimately bonded is intended to signify that a tenacious grip is established across substantially the entire surface area of the conjoining surfaces, thus resulting in enhanced resistance to delamination. Intimately bonded to the reflective layer on the side thereof opposite the cover sheet is a protective layer of substantially inert and corrosion-resistant material. A pressure-sensitive adjesive may be applied to the protective layer for mounting the article on a support member or base.

The article is produced utilizing conventional sputtering techniques to deposit a specularly reflective layer of silver upon one side of a polymeric substrate. Sputtering continues for a time sufficient to ensure opacity of the reflective layer. A protective layer is then formed on the reflective layer on the side thereof opposite the substrate by sputtering from a target of material which is both substantially inert towards the reflective layer and highly resistant to any reducing agents likely to be encountered in the environment wherein the reflector will be situated.

BRIEF DESCRIPTION OF THE DRAWINGS

Reference is now made to the several drawings wherein like reference numerals refer to like parts throughout the several views, and wherein.

BEST MODE FOR CARRYING OUT THE INVENTION

Figure 1:
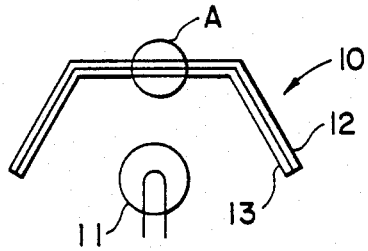
FIG. 1 is a side elevation of one form of a radiant energy reflector constructed in accordance with this invention.

Referring to FIG. 1, illustrated therein is a radiant energy reflector 10 supported by any means (not shown) in spaced relationship with a radiant energy source 11. Reflector 10 preferably takes the form of a substantially rigid member or base 12 having a laminated article or sheet 13 mounted on the side thereof facing radiant energy source 11.

Figure 2:
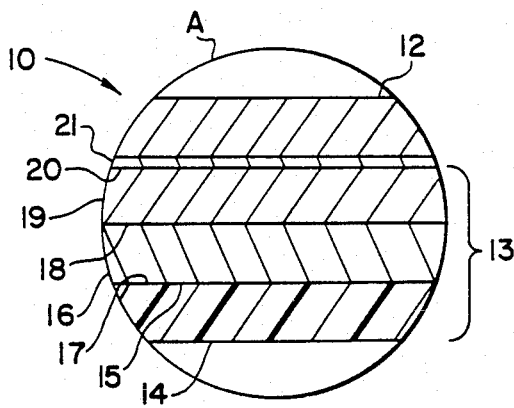
FIG. 2 is a partial, cross-sectional view, in greatly exaggerated dimensions, of the encircled portion of the reflector shown in FIG. 1.

Referring to FIG. 2, the preferred structure of reflector 10 is illustrated therein, in greatly exaggerated dimensions, in a partial cross-sectional view of the reflector which is representative of the encircled portion in FIG. 1 identified by reference character A. Exaggerated dimensions are employed to more clearly illustrate the structure of the reflector, and not to suggest relative size of the various reflector components.

Sheet 13, as indicated by the bracket, comprises a transparent, polymeric cover sheet 14, a metallic layer 16 of silver intimately bonded to surface 15 of cover sheet 14 and defining a highly specularly reflective surface 17, and a protective layer 19 of substantially inert and corrosion-resistant material intimately bonded to surface 18 of metallic layer 16. Sheet 13 may be mounted on support member or base 12 by any suitable means, and in the preferred embodiment such means comprises a layer 21 of pressure-sensitive adhesive applied to surface 20 of protective layer 19.

Support member or base 12 may be formed from any material sufficiently rigid to support sheet 13 in a predetermined geometrical shape, and in the preferred embodiment comprises a sheet of aluminum which is easily bent to the desired shape after sheet 13 is mounted thereupon.

Cover sheet 14 may be formed from virtually any polymeric material which exhibits durability, transparency, and resistance to environmental agents such as water and oxygen. However, commercially available polyethylene terephthalate, such as Mylar, is particularly preferred because it additionally exhibits a very smooth surface texture. A smooth surface texture is desirable for ensuring that the reflective surface of the underlying metallic layer is as smooth as possible to associate high specularity therewith, and for reducing light scattering losses at the cover sheet/air interface. While the thickness of the cover sheet is not particularly critical, it is normally between about 1 to 30 mils thick, with 1.5 mils being preferred.

Metallic layer 16 comprises substantially pure silver selected because of the exceptionally high specularity associated therewith towards radiant energy in the visible light spectrum. Layer 16 is preferably not less than about 100 Å thick to ensure opacity, with 400 Å being preferred.

Protective layer 19 preferrably comprising a metal exhibiting corrosion-resistance and chemical inertness towards the silver of metallic layer 16. While various metals such as gold, chromium, and Inconel are satisfactory, the preferred embodiment employs a layer of Type 316 Stainless Steel not less than about 10 Å thick, with about 100 Å being preferred. Alternatively, the protective layer can also be formed from ceramic, glass and the like if flexibility of sheet 13 is not of critical concern.

As previously discussed, laminated articles or sheets constructed in accordance with the prior art have suffered from the drawback that the individual lamina are not well bonded to one another. This is now largely overcome by forming a reflector of the type shown in FIGS. 1 and 2 by using conventional sputtering techniques to form metallic layer 16 and protective layer 19. In practicing the method of this invention, a sheet of polyethylene terephthalate (such as Mylar) is positioned within a sputtering target of substantially pure silver for a time sufficient to permit the formation of metallic layer 16. Thereafter, protective layer 19 is likewise formed using a sputtering target of Type 316 Stainless Steel or other suitable material.

A characterizing feature of the laminated article of this invention is that a tenacious and intimate bond is established between the cover sheet, metallic layer and protective layer which is less prone to delamination than like articles of the prior art.

Figure 3:
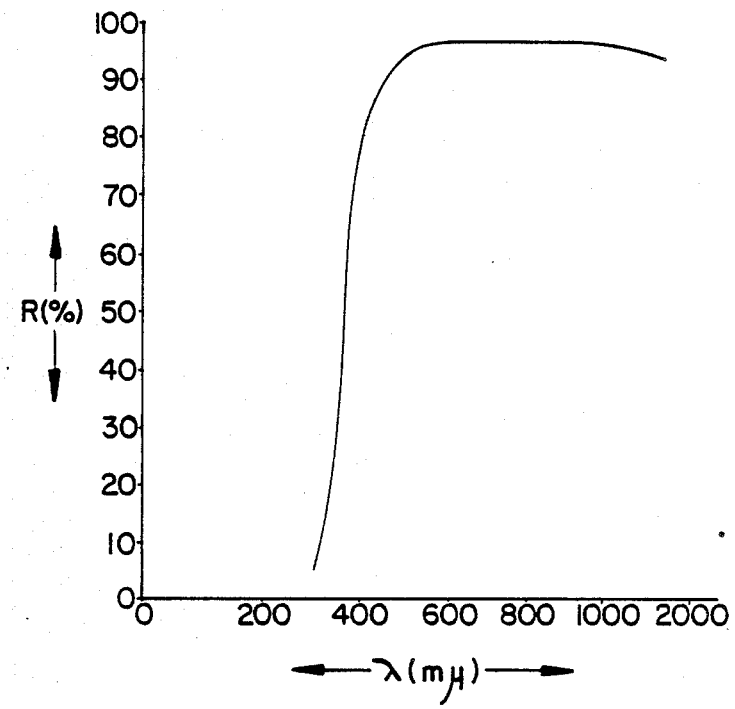
FIG. 3 is a graph of reflectivity versus radiant energy wavelength for one embodiment of a reflector constructed in accordance with the disclosure herein.

The utility of a reflector constructed in accordance with the disclosure herein is demonstrated by reference to the graph shown in FIG. 3. The graph illustrates the reflective response to radiant energy having wavelengths from 300 to 2,000 mμ of a reflector having a polyethylene terephthalate cover sheet about 2 mils thick, a silver metallic layer about 500 Å thick, and a Stainless Steel protective layer about 0.50 mils Å thick. It will be noted that for substantially all points of interest in the visible light spectrum the response of the reflector is quite high. The degree to which the response approached ideal was somewhat unexpected since it was presumed that the thickness of the cover sheet would result in increased light loss due to adsorption. Of course, it is expected that applying anti-reflection coatings on the exposed surface of the cover sheet will likely result in the reflector's response approaching even closer to ideal.

While the present invention has been shown and described with respect to the preferred form thereof, it will be apparent that many modifications and changes may be made therein without departing from the spirit of the invention. Accordingly, all such modifications and changes are contemplated as may come within the scope of the appended claims.

I claim:

1. A radiant energy reflector comprising a radiant energy transmissive cover sheet of polyethylene terephathalate, a specularly reflective layer of silver which is not less than about 100 Å thick intimately bonded to one side of said cover sheet, and a non-polymeric protective layer comprising stainless steel intimately bonded to said reflective layer on the side opposite said cover sheet.

2. A radiant energy reflector comprising a radiant energy transmissive cover sheet of polyethylene terephthalate, a specularly reflective layer of silver intimately bonded to one side of said cover sheet, and a protective layer of Stainless Steel intimately bonded to said reflective layer on the side thereof opposite sand cover sheet.

3. The reflector of claim 2 further comprising a rigid support member or base secured to said protective layer on the side thereof opposite said reflective layer.

4. The reflector of claim 2 wherein said reflective layer is not less than about 100 Å thick.

5. The reflector of claim 4 further comprising a rigid support member or base secured to said protective layer on the side thereof opposite said reflective layer.

6. A method for producing a radiant energy reflector, comprising the steps of forming a specularly reflective layer of silver by sputtering the silver to a thickness of not less than about 100 Å onto one side of a transparent cover sheet formed from polyethylene terephthalate, and then forming a protective layer by sputtering a substantially inert and corrosion resistant material onto said reflective layer on the side thereof opposite said cover sheet.

7. A method for producing a radiant energy reflector, comprising the steps of forming a specularly reflective layer of silver by sputtering the silver to a thickness of not less than about 100 Å onto one side of a transparent cover sheet formed from polyethelene terephthalate, and then forming a protective layer by sputtering stainless steel onto said reflective layer on the side thereof opposite said cover sheet.

8. A method for producing a radiant energy reflector, comprising the steps of forming a specularly reflective layer of silver by sputtering silver onto one side of a transparent cover sheet of polyethylene terephthalate, and then forming a protective layer of Stainless Steel by sputtering Stainless Steel onto said reflective layer on the side thereof opposite said cover sheet.

9. The method of claim 8 further comprising securing a rigid support member or base to said protective layer on the side thereof opposite said reflective layer.

10. The method of claim 8 wherein said reflective layer is deposited to a thickness not less than about 100 Å.

11. The method of claim 10 further comprising securing a rigid support member or base to said protective layer on the side thereof opposite said reflective layer.

12. A radiant energy reflector comprising a radiant energy transmissive sheet of polyethylene terephthalate having a thickness of about 1 to 30 mils, a specularly reflective layer of silver sputter-depositied on one surface of said sheet ot a thickenss of not less than about 100 Å, a protective layer of substantially inert and corrosion-resistant material intimately bonded to the reflective layer, and a pressure sensitive adhesive on the surface of said silver protective layer.

13. A radiant energy reflector comprising, in combination, a rigid support member contoured to provide a face having a predetermined geometrical shape, a radiant energy transmissive sheet of polyethylene terephathalate having a thickness of about 1 to 30 mils adhesively secured to said face of said support member, said sheet having sputter-deposited on that face which is towards the said face of said support member a specularly reflective layer of silver, said layer having a thickness of about 100 Å to 500 Å.

14. A method for producing a radiant energy reflector, comprising the steps of forming a specularly reflective layer of silver by sputting silver to a thickness not less than about 100 Å thick onto one side of a transparent cover sheet, and then forming a protective layer by sputting a substantially inert and corrosion resistant material onto said reflective layer on the side thereof opposite said cover sheet.

15. The method of claim 14 further comprising the step of securing a rigid support member or base to said protective layer on the side thereof opposite said reflective layer.

\* \* \* \* \*